US005732142A

United States Patent [19]

Nagata et al.

[11] Patent Number: 5,732,142

[45] Date of Patent: Mar. 24, 1998

[54] MUSICAL SOUND REPRODUCTION CONTROLLER WITH TWO-STAGE ADJUSTMENT OF TONE

[75] Inventors: Yuichi Nagata; Satoshi Suzuki, both of Hamamatsu, Japan

[73] Assignee: Yamaha Corporation, Hamamatsu, Japan

[21] Appl. No.: 499,630

[22] Filed: Jul. 7, 1995

[30] Foreign Application Priority Data

Jul. 7, 1994 [JP] Japan .................................... 6-179589

[51] Int. Cl.$^{6}$ ................................ H03G 3/00; G10H 1/02

[52] U.S. Cl. ................................ 381/63; 84/622; 84/630; 84/707; 84/DIG. 26

[58] Field of Search ................................ 381/63, 18, 17, 381/101, 102, 84, 61, 98, 1; 84/619, 630, 625, 657, DIG. 26, 622

[56] References Cited

U.S. PATENT DOCUMENTS

| | | | |
|---|---|---|---|
| 3,812,278 | 5/1974 | Aker . | |
| 4,114,497 | 9/1978 | Hiyoshi et al. | 84/622 |
| 4,203,340 | 5/1980 | Ostrom . | |
| 4,237,019 | 12/1980 | Goto . | |
| 4,586,417 | 5/1986 | Kato et al. . | |
| 4,628,789 | 12/1986 | Fujimori | 381/62 |
| 4,683,589 | 7/1987 | Scholz et al. | 381/61 |
| 4,809,336 | 2/1989 | Pritchard | 381/61 |
| 4,984,497 | 1/1991 | Inagaki et al. | 84/622 |
| 4,991,484 | 2/1991 | Kawashima | 84/622 |
| 4,995,084 | 2/1991 | Pritchard | 381/61 |
| 5,050,216 | 9/1991 | Hanzawa et al. | 381/62 |
| 5,157,215 | 10/1992 | Nakae | 84/625 |
| 5,172,415 | 12/1992 | Fosgate | 381/63 |
| 5,216,718 | 6/1993 | Fukuda | 381/18 |
| 5,241,604 | 8/1993 | Noguchi | 381/63 |
| 5,261,005 | 11/1993 | Masayuki | 381/63 |
| 5,448,009 | 9/1995 | Kudo | 84/622 |
| 5,477,003 | 12/1995 | Muraki | 84/65 T |

FOREIGN PATENT DOCUMENTS

| | | | |
|---|---|---|---|
| 166543 | 1/1986 | European Pat. Off. . | |
| 64-73394 | 3/1989 | Japan . | |
| 2112100 | 9/1990 | Japan . | |
| 3113478 | 5/1991 | Japan | 84/625 |
| 1598746 | 4/1978 | United Kingdom . | |
| 2098031 | 11/1982 | United Kingdom . | |
| 8302700 | 8/1983 | WIPO . | |

OTHER PUBLICATIONS

British Search Report dated Oct. 11, 1995, Appl. No. GB 9513862.4.

Radio Designer's Handbook Edited by F. Langford Smith Fourth Edition, 1953 ILIFFE, London, pp. 661, 999.

*Primary Examiner*—Curtis Kuntz
*Assistant Examiner*—Xu Mei
*Attorney, Agent, or Firm*—Loeb & Loeb LLP

[57] ABSTRACT

A sound reproduction control apparatus processes an audio signal in reproduction of a musical sound to control a tone of the musical sound while imparting an effect to the musical sound. A preceding tone controller has a variable frequency response for amplifying the audio signal by the variable frequency response so as to variably control the tone of the musical sound. A signal processor is connected to the preceding tone controller for processing the audio signal to impart a desired effect to the musical sound. A succeeding tone controller is connected to the processor means and has an adjustable frequency response adjusted separately from the variable frequency response of the preceding tone controller for amplifying the audio signal by the adjusted frequency response so as to adjustively control the tone of the musical sound.

15 Claims, 4 Drawing Sheets

MUSICAL SOUND REPRODUCTION CONTROLLER WITH TWO-STAGE ADJUSTMENT OF TONE

BACKGROUND OF THE INVENTION

The present, invention relates to a sound reproduction control apparatus suitably utilized to adjust a tone of musical sounds reproduced by an amplifier, and utilized to adapt a frequency response of an amplifier to a sound field in which the musical sound is reproduced.

In installation of the amplifier, it is desired to adapt the frequency response thereof to a specified use and situation of the installed amplifier. Generally, a tone of the reproduced sound varies dependently on dimension and configuration of a listening room or dependently on transmission characteristics of a loudspeaker. Therefore, the frequency response of the amplifier should be adjusted for the actual use and situation so as to realize a desired tone. Particularly, the adjustment of the frequency response for the use and situation is quite important to a specific type of a mixing amplifier called "karaoke amplifier" which amplifies and mixes a live vocal part and an orchestral accompaniment part, because such a mixing amplifier is installed in a public karaoke facility or other places under diverse conditions. Recently, a sophisticated karaoke amplifier is developed, which uses four to six member of loudspeakers separately located to reproduce the musical sound by improved presence. Another type of the karaoke amplifier is provided with function to simulate a sound field such as a concert-hall and a stadium. In order to fully exhibit such a simulative function, it is necessary to adjust the frequency response of the karaoke amplifier for the actual use and situation.

On the other hand, when a music composition is reproduced by means of the amplifier, generally a tone of the reproduced music composition is adjusted according to user's choice. Particularly, the karaoke amplifier reproduces diverse number of songs, hence the tone of the reproduced sound is frequently adjusted to match a melody of an individual song by varying the frequency response of the karaoke amplifier. However, the individual tone adjustment for the melody or the like would deteriorate the basic tone adjustment for the use and situation, thereby disadvantageously obstructing full performance of the amplifier.

SUMMARY OF THE INVENTION

In view of the above noted drawbacks of the prior art, an object of the invention is to provide a sound reproduction control apparatus constructed to maintain the basic tone adjusted for a specified use and situation while allowing tone variation adjusted for individual musical compositions or the like.

According to a first aspect of the invention, a reproduction characteristic control apparatus comprises first frequency response control means for controlling a frequency response to an input signal, signal processing means for applying a predetermined signal process to an output signal of the first frequency response control means, and second frequency response control means for controlling a frequency response to an output signal of the signal processing means.

According to a second aspect of the invention, a reproduction characteristic control apparatus comprises first frequency response control means for controlling a frequency response to a stereophonic input signal, signal processing means for producing and outputting a multiple of channel signals based on an output signal of the first frequency response control means, and second frequency response control means for controlling a frequency response to each channel signal outputted from the signal processing means.

According to a third aspect of the invention, a sound reproduction control apparatus processes an audio signal in reproduction of a musical sound to control a tone of the musical sound while imparting an effect to the musical sound. The apparatus comprises first tone controller means having a variable frequency response for amplifying the audio signal by the variable frequency response so as to variably control the tone of the musical sound, processor means connected to the first tone controller means for processing the audio signal to impart a desired effect to the musical sound, and second tone controller means connected to the processor means and having an adjustable frequency response adjusted separately from the variable frequency response of the first tone controller means for amplifying the audio signal by the adjusted frequency response so as to adjustively control the tone of the musical sound.

In operation of the inventive apparatus, the second frequency response controller means or second tone control means has the adjustable frequency response which is adjusted according to the specific use and situation of the amplifier, while the first, frequency response control means or the first tone controller means has the variable frequency response which is freely adjusted according to a user's desire. Consequently, the tone of the reproduced sound can be freely varied in matching with a melody or the like, while maintaining the basic or fundamental tone of the reproduced sound, which is adapted to the use and situation such as a sound field. With regard to the stereophonic audio signal, the basic frequency response is adjusted for each of the final outputs of the multiple channels so as to achieve more practical tone control. Preferably, the adjustment or setting of the frequency response of the second tone controller means is prohibited unless a specific switch operation is carried out, thereby avoiding inadvertent change of the adjustment and maintaining the fundamental tone of the sound.

DETAILED DESCRIPTION OF THE INVENTION

Figure 1:
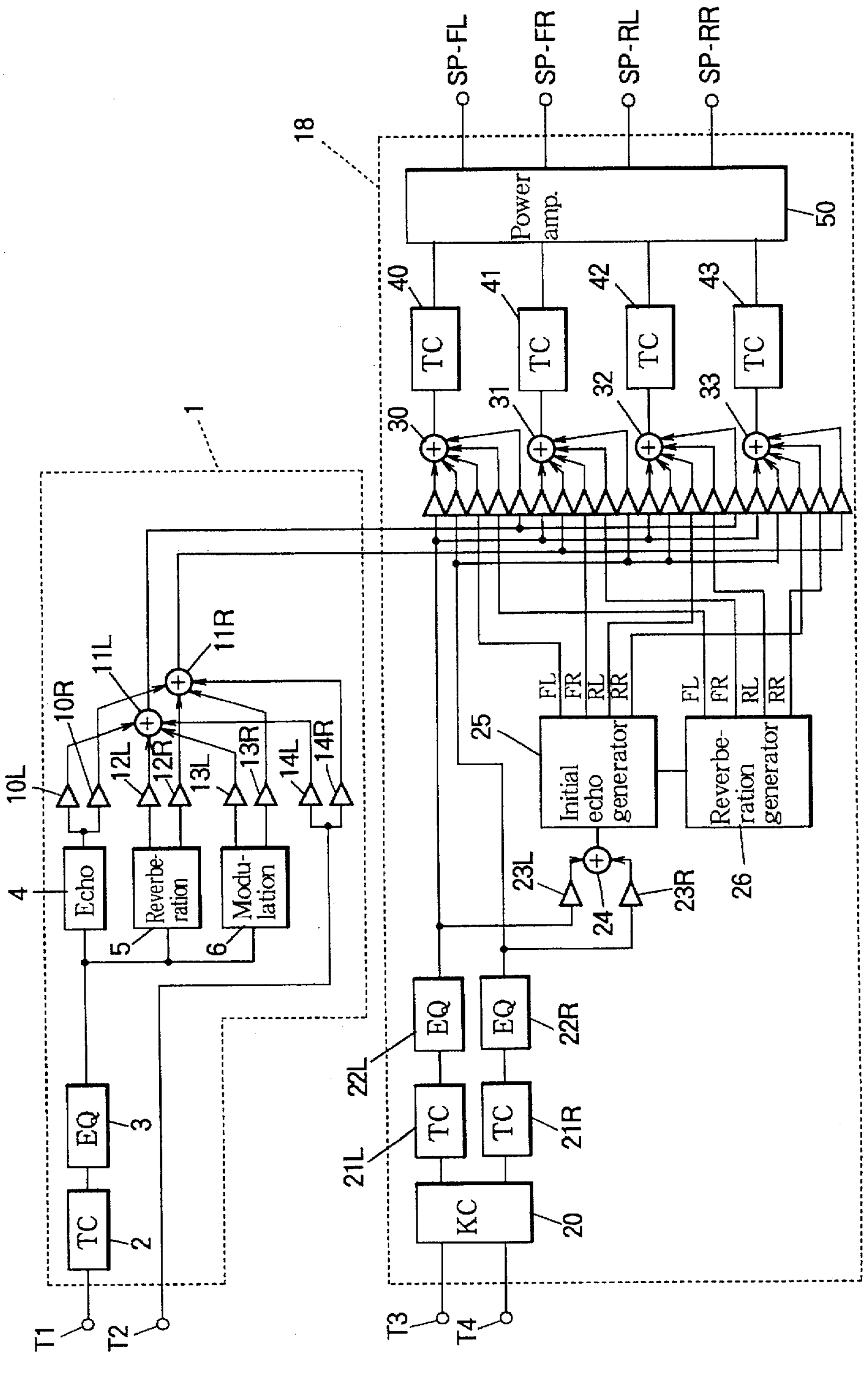
FIG. 1 is a block diagram showing a first embodiment of the present invention.

Hereinafter, embodiments of the invention will be described in conjunction with the drawings. FIG. 1 is a block diagram showing a construction of the first embodiment according to the invention. This embodiment is directed to a karaoke amplifier as one application of the invention. The apparatus has a vocal amplifier unit 1 which receives a voice signal or live vocal audio signal from a microphone (not shown in the figure), which then applies various processes to the voice signal, and thereafter which amplifies the same for outputting. More specifically, the voice signal is inputted from the microphone to both of parallel input terminals T1 and T2 through an A/D converter (not shown). The voice signal received at the input terminal T1 is fed through a three-band tone control circuit (TC) 2 and a subsequent three-band equalizer (EQ) 3 to those of an echo processor 4, a reverberation processor 5 and a modulation processor 6. The three-band tone control circuit 2 has various curves of a frequency response, which are preset at factory in matching with desired types of a sound field. Further, the three-band equalizer 3 has a certain frequency response which is preset at factory suitably for vocal performance reproduction.

The echo processor 4 superposes an echo signal to the voice signal, which is then fed to a pair of adders 11L and 11R through respective buffers 10L and 10R. The reverberation processor 5 superposes a reverberation signal to the voice signal, which is then fed to the respective ones of the adders 11L and 11R through parallel buffers 12L and 12R. Similarly, the modulation processor 6 applies a desired modulation such as pitch shift to the voice signal, which is then fed to the respective ones of the adders 11L and 11R through parallel buffers 13L and 13R. An output signal from the adder 11L is fed to each of subsequent adders 30 and 32 through buffers. Similarly, an output signal from the other adder 11R is fed to each of subsequent adders 31 and 33 through buffers. On the other hand, the original voice signal received at the separate input terminal T2 from the microphone is directly fed to each of the adders 11L and 11R through parallel buffers 14L and 14R. These of the echo processor 4, the reverberation processor 5 and the modulation processor 6 cooperate in combination with each other to create a desired effect or to simulate a desired sound field.

The apparatus further includes a musical sound amplifier unit 18 which receives a stereophonic digital musical sound signal or stereophonic audio signal at terminals T3 and T4, which then converts the sound signal into four channel signals corresponding to front left, front right, rear left, and rear right channels of the sound reproduction, and thereafter which amplifies and outputs these four channel signals to corresponding ones of front left speaker SP-FL, front right speaker SP-FR, rear left speaker SP-RL and rear right speaker SP-PR. The musical sound amplifier 18 includes a key control circuit, (KC) 20 which operates according to commands for effecting pitch control of the inputted digital sound signal representative of a musical composition such as an orchestral accompaniment of a karaoke song. Namely, the key control circuit 20 controls the key of the musical composition to be reproduced. The thus key-controlled digital stereophonic sound signal is fed to a two-band tone control circuit 21L of a left, channel L, and is also fed to another two-band tone control circuit 21R of a right channel R. These tone control circuits variably determine a sound quality or tone of the reproduced sound at lower and higher frequency bands.

Figure 2:
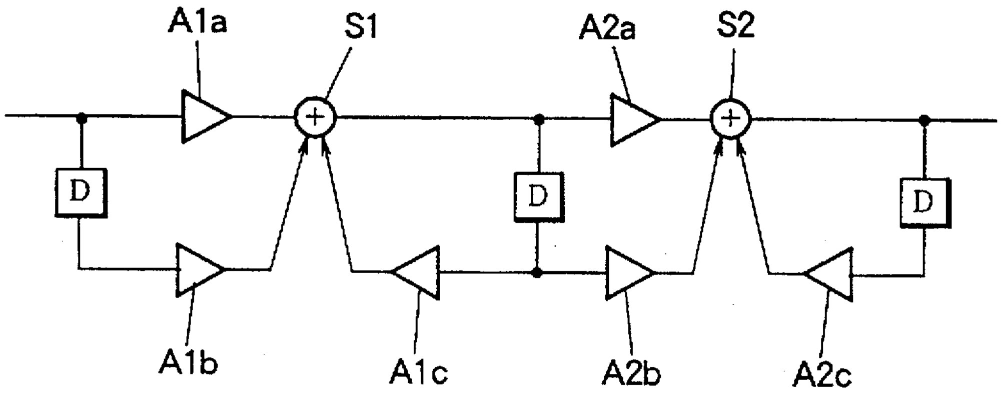
FIG. 2 is a circuit diagram showing a two-band tone control circuit provided in the first embodiment.

FIG. 2 is a block diagram showing a construction of the two-band tone control circuits 21L and 21R. The circuit is composed of delay elements D, adder elements S1 and S2, amplifier elements A1*a*, A1*b* and A1*c* which attribute to tone control of the lower frequency band, and other amplifier elements A2*a*, A2*b* and A2*c* which attribute to tone control of the higher frequency band. In this construction, a gain variation of the amplifier element A1*c* dominantly influences a frequency range variation of the lower band as well as a gain variation of the amplifier element A2*c* dominantly influences a frequency range variation of the higher band. On the other hand, a gain variation of the amplifier elements A1*a* and A1*b* dominantly influences an output gain or amplitude level variation of the lower band, while a gain variation of the amplifier elements A2*a* and A2*b* dominantly influences an output gain variation of the higher band. Therefore, the gains of the amplifier elements A1*a*, A1*b* and A1*c* are selectively set to adjust the frequency range and the amplitude level of the lower band, while the gains of the amplifier elements A2*a*, A2*b* and A2*c* are selectively set to adjust the frequency range and the amplitude level of the higher band.

Referring back to FIG. 1, the output signals from the two-band tone control circuits 21L and 21R are fed, respectively, to four-band parametric equalizers 22L and 22R, where desired equalizing characteristics are imparted to the fed signals. An output signal of the left four-band parametric equalizer 22L is distributed to each of the adders 30, 31, 32 and 33 through buffers. The same output signal is separately fed to an intermediate adder 24 through a buffer 23L. Similarly, an output signal of the right four-band parametric equalizer 22R is distributed to each of the adders 30–33 through buffers. The same output signal is separately fed to the intermediate adder 24 through a buffer 23R. An output signal of the adder 24 is fed to an initial or first echo generator 25, where initial echo signals in four directions of front left (FL), front right (FR), rear left (RL) and rear right (RR) are generated and superposed to the sound signal to form four directional audio signals. The adders 30, 31, 32 and 33 correspond to respective ones of the four directions FL, FR, RL and RR, and are connected to receive through the buffers the corresponding ones of the four directional signals outputted from the initial echo generator 25. In such a construction, the initial echo generator 25 processes the sound signal to create an effect in the form of an echo signal corresponding to a selected one of preset sound fields. Stated otherwise, the initial echo generator 25 generates the echo signal according to control parameters memorized correspondingly to the selected preset sound field. A detailed construction of such an initial echo generator is described, for example, in Japanese Utility Model Application Laid-open No. 2-112100 (1990).

Further, the musical sound amplifier unit 18 contains a reverberation generator 26 which is provided to supplementally generate another effect in the form of a reverberation signal in case that the echo signal generated by the initial echo generator 25 cannot fully reconstruct the desired sound field. For example, the echo effect provided by the initial echo generator 25 may not be sufficient to alone reproduce a sound field of a room space such as a church having a long reverberation duration. In such a case, the reverberation generator 26 supplements a necessary reverberation effect. An output signal of the reverberation generator 26 is formed in the four directions FL, FR, RL and RR. The four directional components of the sound signal are distributed to the corresponding adders 30, 31, 32 and 33, respectively. The reverberation generator 26 may be composed of a comb filter and a cascaded all-pass filters.

Respective output signals of the adders 30, 31, 32 and 33 are fed to an output or power amplifier 50 through corresponding ones of two-band tone control circuits 40, 41, 42 and 43, each of which has the same structure as shown in FIG. 2. Output signals of the respective two-band tone control circuits 40–43 are inputted into the amplifier 50. The amplifier 50 converts the inputted digital signals of the four directions FL, FR, RL and RR into analog signals by means of a D/A converter, and then carries out power amplification of the analog signals, which are distributed to the corresponding speakers SP-FL, SP-FR, SP-RL and SP-RR.

Next, the description is given for operation of the first embodiment constructed as described above. First, basic setting of the frequency response of the two-band tone control circuits 40–43 is carried out according to a specified use and situation of the apparatus. The use and situation includes external condition such as configuration, dimension, wall material, window size and window position of a room in which the apparatus is installed, and an internal condition such as transmission characteristics of the power amplifier 50 and the speakers. The room configuration etc. may be varied dependently on installation spots, and the transmission characteristics of the power amplifier and the speakers may vary among individual commercial products. In view of this, the basic or fundamental frequency response should be adjusted to a specific use and situation of the individual apparatus.

Thus, initial gain control is conducted in the amplifier elements A1*a*–A1*c* and A2*a*–A2*c* of the respective two-band tone control circuits 40–43 so as to adjust the tone of the musical sound emitted from the respective loudspeakers. The gain control may be manually conducted while listening to test sounds emitted from the loudspeakers. Practically, the two-band tone control circuits 40–43 are adjusted to obtain a desired tone of the test sound reproduced through the loudspeaker. Alternatively, the adjustment may be carried out with the aid of a measurement device. The tone may be adjusted differently among the multiple of the loudspeakers, or adjusted uniformly for each loudspeaker. For example, if there is no substantial difference in the tone between the pair of the front speakers, gain control volumes are commonly interconnected between the two-band tone control circuits 40 and 41. Similarly, the two-band tone control circuits 42 and 43 are concurrently and commonly adjusted with each other if there is no substantial tone difference therebetween. Further, the adjustment is achieved to eliminate tone difference between the front pair of the speakers SP-FL and SP-FR, and the rear pair of the speakers SP-RL and SP-RR. The tone adjustment is conducted to adapt the frequency response of the two-band tone control circuits 40–43 to the specified use and situation. Stated otherwise, the frequency response is adapted to the sound field specified by the use and situation of the karaoke amplifier. The musical sound signal is amplified according to the frequency response which is set as described above to thereby reproduce the musical sound having the tone adapted to the use and situation of the karaoke amplifier. The user sings a vocal performance with the microphone in matching with the reproduced sounds of the karaoke accompaniment. The singing voice is also amplified by the vocal amplifier unit 1, and is then emitted from the loudspeakers SP-FL, SP-FR, SP-RL and SP-RR together with the automatic orchestral accompaniment to form a composite karaoke performance.

Next, gain control volumes of the first or preceding two-band tone control circuits 21L and 21R are manipulated to vary the basic tone of the reproduced musical sound in matching with a specific melody of the musical composition. The tone is varied according to the gain factors of the preceding two-band tone control circuit 21L and 21R, while the gain factors of the succeeding two-band tone control circuits 40–43 are fixed so as to well maintain their frequency responses initially adjusted to the use and situation. Namely, the gain factors of the first or preceding two-band tone control circuits 21L and 21R are freely adjusted to vary the volume level of the sound in either of the higher and lower bands separately from the basic frequency response adapted to the use and situation. Consequently, the tone can be freely adjusted to the melody and the like without deviating from the basic tone adapted to the use and situation. On the other hand, if the preceding two-band tone control circuits 21L and 21R alone are utilized to effect overall tone control without providing the second or succeeding two-band tone control circuits 40–43, the actual tone may be seriously deviated from a desired one matching the use and situation.

Figure 3:
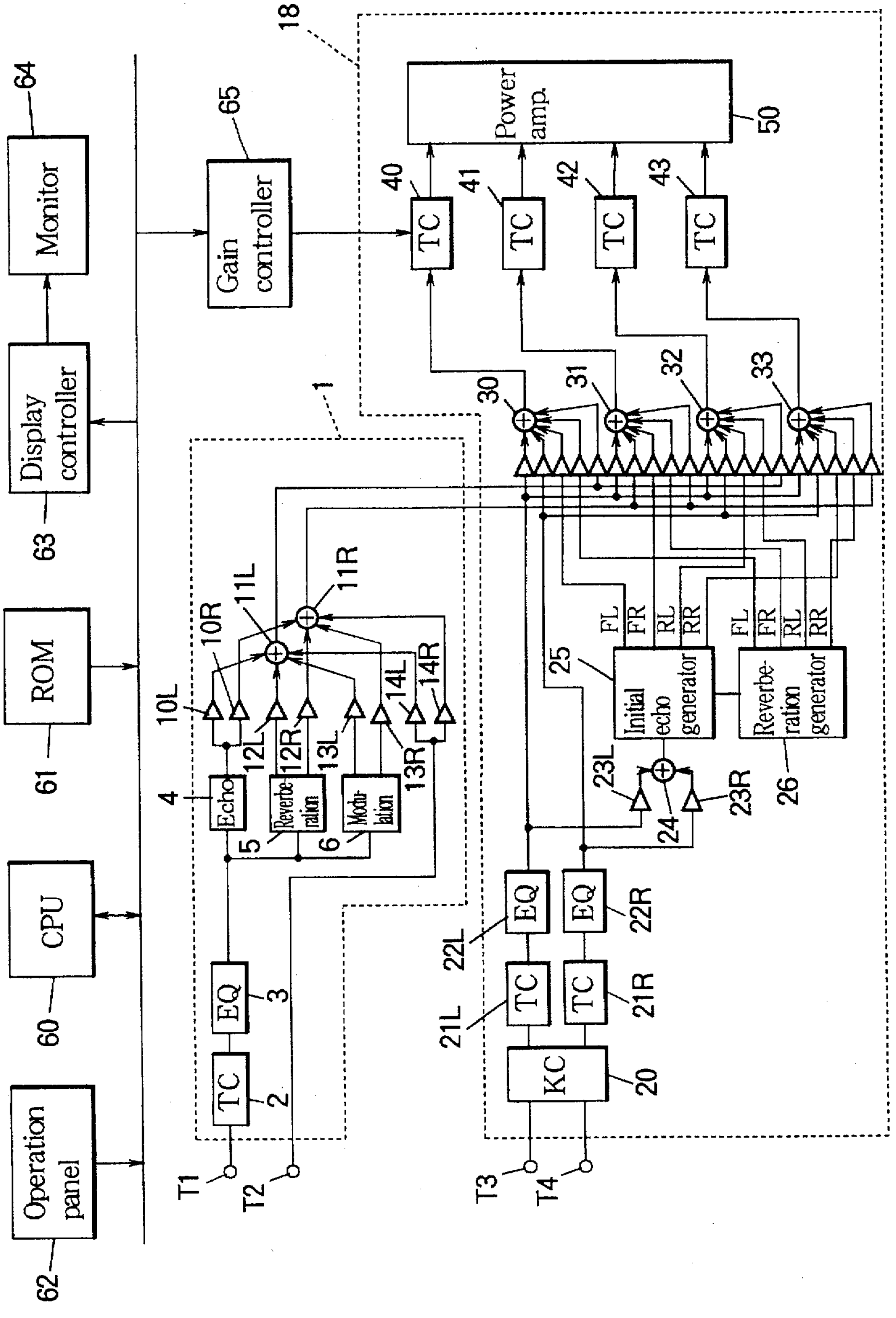
FIG. 3 is a block diagram showing a second embodiment of the present invention.

FIG. 3 is a schematic block diagram showing the second embodiment of the inventive apparatus. This embodiment utilizes a computer to carry out by software process the gain adjustment of the two-band tone control circuits 40–43 which are the same as the first embodiment. In the figure, a CPU 60 operates based on a program stored in a ROM 61. An operation panel 62 is manually operated to input various commands into the CPU 60. A display controller 63 displays various images on a screen of a monitor 64. The display controller 63 has an internal video RAM, and stores various picture information, icons and image data.

A gain controller 65 operates under the control by the CPU 60 to control gains of the amplifier elements A1*a*–A1*c* and A2*a*–A2*c* within the two-band tone control circuits 40–43. In this embodiment, a digital volume is provided to adjust the gain of the two-band tone control circuits 40–43. The gain controller 65 controls each digital volume.

Next, the description is given for the graphic operation of the second embodiment. First, the panel 62 is operated to select an initial setting mode. For example, while a particular switch is depressed, a power switch is turned on to call the initial setting mode. The CPU 60 detects such a specific sequence of the switch operation to establish the initial setting mode. The initial setting mode is never established unless such a sequential switch operation is detected.

Figure 4:
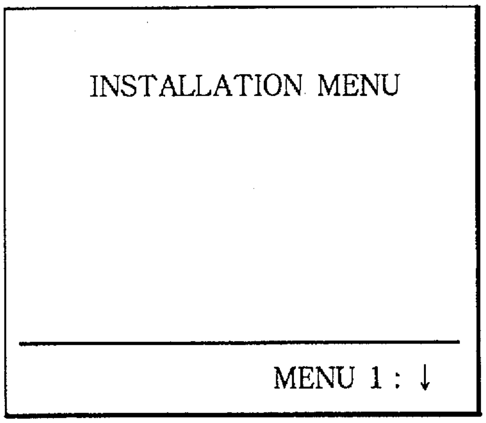
FIG. 4 is a screen view showing graphic operation in the second embodiment.

Once the initial setting mode is established, the display controller 63 displays a guide message of the initial setting mode on a screen of the monitor 64. FIG. 4 shows the guide screen, where a message "INSTALLATION MENU" is displayed on an upper zone of the screen to indicate that the initial setting mode is established. Further, an instruction "MENU 1:↓" is displayed on a lower zone of the screen. This instruction indicates that depression of an arrow key provided on the panel 62 causes updating of menu item number. Then, the arrow key is actually depressed to successively scroll menu items of various setting modes.

Figure 5:
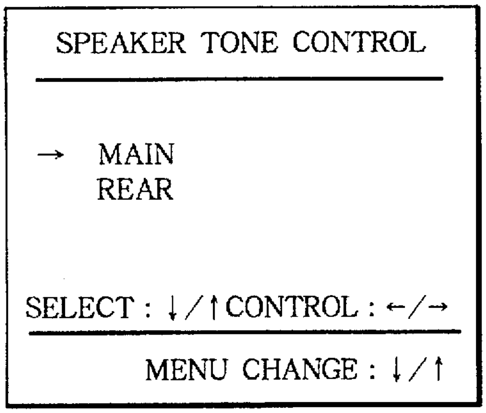
FIG. 5 is another screen view showing the graphic operation in the second embodiment.

When the particular menu is selected to set the frequency response, the monitor displays a message on the screen as shown in FIG. 5. A message "SPEAKER TONE CONTROL" is indicated on the top zone of the screen to indicate that the setting of the frequency response is allowed. Further, marks "MAIN" and "REAR" are indicated on a central zone of the screen together with an arrow which points either of "MAIN" and "REAR,". The mark "MAIN" designates the front speakers SP-FL and SP-FR, and the mark "REAR." designates the rear speakers SP-RL and SP-RR. An up arrow key or a down arrow key is depressed to select one of the marks "MAIN" and "REAR". Either of right and left arrow keys is depressed to enter adjustment of the frequency response.

Figure 6:
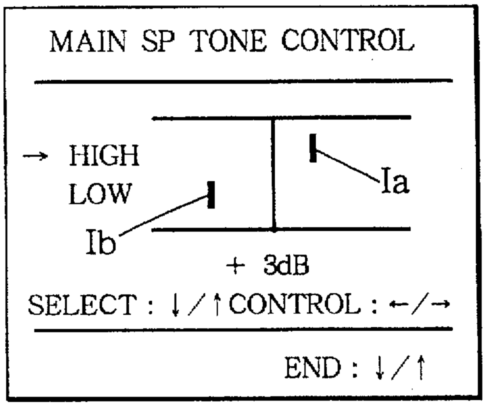
FIG. 6 is a further screen view showing the graphic operation in the second embodiment.

Now, the right or left arrow key is depressed while the mark "MAIN" is designated, so that the screen is switched as shown in FIG. 6 to display a virtual representation of the actual frequency response. A message "MAIN SP TONE CONTROL" is displayed on the upper zone of the screen to indicate the tone control mode of the front speakers. The central zone of the screen displays two rows of "HIGH" which designates the higher band and "LOW" which designates the lower band. The respective rows include indicators I*a* and I*b* which indicate levels. Further, a pointing arrow is displayed to indicate which of "HIGH" and "LOW" is selected. Then, the up and down arrow keys are operated to select a desired band.

Under the state where the item "HIGH" is selected, the right and left arrow keys are actuated by graphic operation to displace the indicator I*a* in a direction corresponding to the actuated arrow key. The gain controller 65 adjusts the gain of the amplifier elements A2a–A2c contained in the two-band tone control circuits 40 and 41 according to the position of the indicator Ia. In similar manner, when the item "LOW" is selected, the gain of the amplifier elements A1a–A1c contained in the two-band tone control circuits 40 and 41 is automatically adjusted according to the position of the indicator Ib. In similar manner, when the item "REAR" is selected in the screen shown in FIG. 5, the gain of the amplifier elements A1a–A1e and A2a–A2c of the two-band tone control circuits 42 and 43 is adjusted according to the graphic operation on the screen shown in FIG. 6.

By such a manner, the frequency response of the karaoke amplifier is adjusted to the use and situation. Thereafter, the karaoke amplifier is operated in manner similar to the first embodiment. For example, the gain of the preceding two-band tone control circuits 21L and 21R is adjusted to obtain a tone variation as desired by the user in matching with a musical composition or else.

In the second embodiment, a specific switch operation must be carried out in order to call the initial setting mode. Therefore, in the regular operation, customers or users cannot easily change the once adjusted basic frequency response so as to stably maintain the initial setting state. Particularly, users or customers frequently operate the karaoke amplifier in a public facility. In such an open circumstance, the initial basic frequency response adapted to the sound field can be well reserved in the second embodiment.

In a modification, the gain factors of the lower and higher bands in the two-band tone control circuits 21L and 21R are automatically adjusted to a sound field to be simulated. Namely, the level of the respective band is provisionally memorized for different types of sound fields. The appropriate level is retrieved correspondingly to a selected type of the sound field for the automatic setting. In another modification, the amplifier receives an input signal in the form of a monaural signal or a multi-channel signal rather than the stereophonic signal of the disclosed embodiments. In a further modification, the present invention can be applied not only to the karaoke amplifier of the disclosed embodiments, but also to a regular audio amplifier.

As described above, according to the present invention, the fundamental frequency response adapted to the use and situation can be well reserved while a tone variation is freely introduced according to a melody of musics or else.

What is claimed is:

1. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variably control the tone of the musical sound;

processor means connected to the first tone controller means for processing the audio signal to impart a desired effect to the musical sound; and second tone controller means connected to the processor means and having an adjustable frequency response adjusted independently of the variable frequency response of the first tone controller means for amplifying the audio signal by the adjusted frequency response so as to adjustably control the tone of the musical sound.

2. A sound reproduction control apparatus according to claim 1, including input means for inputting an audio signal having a live vocal component and an automatic accompaniment component and means for forming a mixture of a live vocal performance representative of the live vocal component and an automatic accompaniment performance representative of the automatic accompaniment component to thereby constitute a karaoke performance.

3. A sound reproduction control apparatus according to claim 1, including display means having a screen for displaying thereon a virtual representation of the adjustable frequency response of the second tone controller means, and operation means for graphically operating the screen over the displayed virtual representation to adjust the frequency response of the second tone controller means by the graphic operation.

4. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variable control the tone of the musical sound;

processor means connected to the first tone controller means for processing the audio signal to impart a desired effect to the musical sound; and second tone controller means connected to the processor means and having an adjustable frequency response adjusted separately from the variable frequency response of the first tone controller means for amplifying the audio signal by the adjusted frequency response so as to adjustably control the tone of the musical sound, wherein the first tone controller means comprises means for variably controlling the tone in matching with a melody of the musical sound, and the second tone controller means comprises means for adjustably controlling the tone adapted to a sound field in which the musical sound is reproduced.

5. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variably control the tone of the musical sound;

processor means connected to the first tone controller means for processing the audio signal to impart a desired effect to the musical sound;

second tone controller means connected to the processor means and having an adjustable frequency response adjusted separately from the variable frequency response of the first tone controller means for amplifying the audio signal by the adjusted frequency response so as to adjustably control the tone of the musical sound; and means for allowing variation of the variable frequency response of the first controller means and prohibiting variation of the adjusted frequency response of the second tone controller means.

6. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variably control the tone of the musical sound;

processor means connected to the first tone controller means for processing the audio signal to impart a desired effect to the musical sound; and second tone controller means connected to the processor means and having an adjustable frequency response adjusted separately from the variable frequency response of the first tone controller means for amplifying the audio signal by the adjusted frequency response so as to adjustably control the tone of the musical sound, wherein the audio signal includes a stereophonic audio signal and the musical sound includes multiple reproduction channels, and wherein the first tone controller means comprises means for amplifying the stereophonic audio signal, the processor means comprises means subsequently connected to the first tone controller means for producing multiple audio signals to form the musical sound based on the amplified stereophonic audio signal in correspondence with the multiple reproduction channels of the musical sound and separately imparting a desired effect to each of the multiple reproduction channels, and the second tone controller means comprises means subsequently connected to the processor means for amplifying each of the multiple audio signals and separately controlling the tone for each of the multiple reproduction channels.

7. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variably control the tone of the musical sound;

processor means connected to the first tone controller means for processing the audio signal to impart a desired effect to the musical sound; and second tone controller means connected to the processor means and having an adjustable frequency response adjusted separately from the variable frequency response of the first tone controller means for amplifying the audio signal by the adjusted frequency response so as to adjustably control the tone of the musical sound, wherein each of the first tone controller means and the second tone controller means comprises a multi-band tone control circuit having a frequency response effective to set a plurality of variable frequency ranges in the audio signal and effective to change an amplitude level of the audio signal for each of the variable frequency ranges.

8. A sound reproduction control apparatus for processing an audio signal in reproduction of a musical sound to control a tone of the musical sound while imparting an effect to the musical sound, the apparatus comprising:

first tone controller means having a variable frequency response for amplifying the audio signal by the variable frequency response so as to variably control the tone of the musical sound;

processor means connected to the first tone controller means for processing the audio signal to impart a desired effect to the musical sound; and second tone controller means connected to the processor means and having an adjustable frequency response adjusted independently of the variable frequency response of the first tone controller means for receiving the audio signal which is first amplified by the first tone controller means and for further amplifying the received audio signal by the adjusted frequency response so as to adjustably control the tone of the musical sound.

9. A sound reproduction control apparatus for processing an audio signal in reproduction of a musical sound to control a tone of the musical sound while imparting an effect to the musical sound, the apparatus comprising:

a first tone controller having at least a first variable frequency response for amplifying the audio signal by the first variable frequency response;

a processor connected to the first tone controller for processing the audio signal outputted from the first tone controller to impart a specified effect to the audio signal; and a second tone controller connected to the processor, the second tone controller having at least a second adjustable frequency response adjusted independently of the first variable frequency response for amplifying the audio signal first amplified by the first tone controller by the adjusted second frequency response so as to adjustably control the tone of the musical sound.

10. A sound reproduction control apparatus according to claim 9, wherein the first tone controller comprises means for variably controlling the tone in matching with a melody of the musical sound, and the second tone controller comprises means for adjustably controlling the tone adapted to a sound field in which the musical sound is reproduced.

11. A sound reproduction control apparatus according to claim 9, further comprising means for allowing variation of the first variable frequency response of the first tone controller and prohibiting variation of the adjusted second frequency response of the second tone controller means.

12. A sound reproduction control apparatus according to claim 9, wherein the audio signal includes a stereophonic audio signal and the musical sound includes multiple reproduction channels, and wherein the first tone controller includes means for amplifying the stereophonic audio signal, the processor includes means subsequently connected to the first tone controller for producing multiple audio signals to define the musical sound based on the amplified stereophonic audio signal in correspondence with the multiple reproduction channels of the musical sound and separately imparting a desired effect to each of the multiple reproduction channels, and the second tone controller includes means subsequently connected to the processor means for amplifying each of the multiple audio signals and separately controlling the tone for each of the multiple reproduction channels.

13. A sound reproduction control apparatus according to claim 9, wherein each of the first tone controller and the second tone controller includes a multi-band tone control circuit having a frequency response effective to set a plurality of variable frequency ranges in the audio signal and effective to change an amplitude level of the audio signal for each of the variable frequency ranges.

14. A sound reproduction control apparatus according to claim 9, further comprising input means for inputting an audio signal having a live vocal component and an automatic accompaniment component and means for forming a mixture of a live vocal performance representative of the live vocal component and an automatic accompaniment performance representative of the automatic accompaniment component to define a karaoke performance.

15. A sound reproduction control apparatus according to claim 9, further comprising display means having a screen for displaying thereon a virtual representation of the adjustable frequency response of the second tone controller, and operation means for graphically operating the screen over the displayed virtual representation to adjust the frequency response of the second tone controller by the graphic operation.

* * * * *